(12) United States Patent
Park et al.

(10) Patent No.: US 8,159,869 B2
(45) Date of Patent: Apr. 17, 2012

(54) CIRCUIT AND METHOD FOR GENERATING REFERENCE VOLTAGE, PHASE CHANGE RANDOM ACCESS MEMORY APPARATUS AND READ METHOD USING THE SAME

(75) Inventors: Hae Chan Park, Gyeonggi-do (KR); Se Ho Lee, Gyeonggi-do (KR); Soo Gil Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 269 days.

(21) Appl. No.: 12/648,437

(22) Filed: Dec. 29, 2009

(65) Prior Publication Data

US 2011/0075473 A1    Mar. 31, 2011

(30) Foreign Application Priority Data

Sep. 30, 2009  (KR) .................. 10-2009-0093576

(51) Int. Cl.
*G11C 11/00* (2006.01)
(52) U.S. Cl. ............. 365/163; 365/148; 365/189.09; 365/210.1; 365/210.11
(58) Field of Classification Search ............. 365/210.11
See application file for complete search history.

(56) References Cited

U.S. PATENT DOCUMENTS

| | | | | |
|---|---|---|---|---|
| 5,351,212 | A  * | 9/1994 | Hashimoto | 365/185.21 |
| 6,411,549 | B1 * | 6/2002 | Pathak et al. | 365/185.2 |
| 6,667,924 | B2 * | 12/2003 | Ahmed et al. | 365/189.04 |
| 7,535,747 | B2 | 5/2009 | Lee et al. | |
| 7,573,758 | B2 | 8/2009 | Park et al. | |
| 7,733,711 | B2 * | 6/2010 | Burnett et al. | 365/189.09 |
| 8,027,207 | B2 * | 9/2011 | Fifield et al. | 365/189.09 |
| 2008/0055963 | A1 | 3/2008 | Lee et al. | |
| 2008/0068903 | A1 | 3/2008 | Park et al. | |

FOREIGN PATENT DOCUMENTS

| | | |
|---|---|---|
| JP | 1020040060442 A | 7/2004 |
| KR | 1020010010822 A | 2/2001 |

* cited by examiner

*Primary Examiner* — Tan T. Nguyen
(74) *Attorney, Agent, or Firm* — Ladas & Parry LLP

(57) ABSTRACT

A circuit for generating a reference voltage includes at least one reference cell, a reference cell write driver, a reference cell sense amplifier, and a voltage compensation unit. The reference cell is a variable resistance memory cell. The reference cell write driver writes data to the reference cell. The reference cell sense amplifier reads out the data stored in the reference cell on the basis of a predetermined reference voltage. A voltage compensation unit outputs a compensation reference voltage by controlling the reference voltage in accordance with the output value of the sense amplifier.

17 Claims, 4 Drawing Sheets

CIRCUIT AND METHOD FOR GENERATING REFERENCE VOLTAGE, PHASE CHANGE RANDOM ACCESS MEMORY APPARATUS AND READ METHOD USING THE SAME

CROSS-REFERENCES TO RELATED PATENT APPLICATION

The present application claims priority under 35 U.S.C. 119(a) to Korean Application No. 10-2009-0093576, filed on Sep. 30, 2009, in the Korean Intellectual Property Office, which is incorporated herein by reference in its entirety as set forth in full.

BACKGROUND

1. Technical Field

Various embodiments described herein relate generally to a semiconductor apparatus, and more particularly, to a circuit and method for generating a reference voltage, a phase change random access memory apparatus and a read method.

2. Related Art

A phase change random access memory (PCRAM) apparatus is a nonvolatile memory apparatus that stores data by changing the state of a phase change material. The level of integration per unit area of a memory apparatus can be increased by storing multi-level data in a PCRAM apparatus. In order to implement a multi-level PCRAM apparatus, the state of the phase change material must be accurately controlled.

A typical phase change material has a low resistance in a crystalline state, but high resistance in an amorphous state. Further, in the amorphous state the resistance value of the phase change material increases as time passes.

FIG. 1 is a graph illustrating resistance characteristics of a phase change material with respect to time.

In FIG. 1, in the set state, that is, when the phase change material is at the crystalline state, it can be seen that the resistance value is maintained substantially at the same level, even as time passes. However, in the reset state, that is, when the phase change material is at the amorphous state, it can be seen that the resistance of the phase change material gradually increases as time passes.

FIG. 2 is a graph illustrating resistance distribution with respect to time in a multi-level PCRAM apparatus.

When a PCRAM apparatus is configured to have multiple levels, for example, to store 2 bit data, the resistance value can be controlled such that the phase change random access memory (PCRAM) cell has 00, 01, 10, and 11 data, in which the resistance value of the phase change material increases in the order of 00, 01, 10, and 11.

When the PCRAM cell stores 00 or 01 data, the phase change material has a lower resistance, and the resistance value does not substantially change even as time passes (A, B).

On the contrary, when the PCRAM cell stores 10 or 11 data, the phase change material is at a higher resistance state, and the resistance tends to shift so that the resistance value of the phase change material increases as time passes (C, D).

FIG. 3 illustrates resistance shift in a PCRAM apparatus.

In FIG. 3, A indicates 00 data, B indicates 01 data, C indicates 10 data, and D indicates 11 data, and the resistance increases in the order of 00, 01, 10, and 11.

When four level data is written to each memory cell, a resistance shift in which the resistance of the phase change material storing the data 10 and 11 having a higher resistance state increases will occur as time passes. That is, in FIG. 3, as time passes, the resistance value of the phase change material where the 10 data C or 11 data D is written increases (C', D').

The larger the number of storable data, the more the resistance shift becomes problematic when determining the state of the PCRAM cell.

For example, in a multi-level memory device, when data stored in a cell is read, predetermined bias voltages 'VBIAS1', 'VBIAS2', and 'VBIAS3' that increase or decrease in stages (FIG. 3) are applied to a sensing node, and then the data stored in the cells are read by comparing the voltage of the sensing node to a reference voltage. However, when there is resistance shift, the voltage outputted as the result obtained by sensing the cell data is shifted when the bias voltages are applied, and this shifted voltage is compared to a predetermined reference voltage, and thus the read operations may not be performed accurately.

Further, it is difficult to ensure a sensing margin between multi-level data, whereby undesired data may be read and the reliability of the read operation cannot be ensured.

SUMMARY

Embodiments of the present invention include a circuit and a method for generating a reference voltage for a read operation taking into account resistance changes of a phase change material.

Further, embodiment of the present invention include a PCRAM apparatus and a read method using the same, which can accurately read data, regardless of resistance changes of a phase change material.

A circuit for generating reference voltage according to an embodiment of the present invention includes: at least one reference cell that is formed of a variable resistance memory cell; a write driver for reference cell configured to write data to the reference cell; a sense amplifier for reference cell configured to read out the data stored in the reference cell on the basis of predetermined reference voltage; and a voltage compensation unit configured to output compensation reference voltage by controlling the reference voltage in accordance with the output value of the sense amplifier.

A PCRAM apparatus according to an embodiment of the present invention includes: a memory cell array including a memory cell coupled between a word line and a bit line; a circuit for generating reference voltage configured to generate compensation reference voltage by writing/reading data from/to a reference cell and controlling predetermined reference voltage; and a sense amplifier configured to read the data of the memory cell array in accordance with the compensation reference voltage.

A method of generating reference voltage according to an embodiment of the present invention includes: writing data to a reference cell formed of a variable resistance memory cell; reading the data of the reference cell in accordance with predetermined reference voltage; and generating compensation reference voltage by controlling the reference voltage in accordance with the result of reading the data of the reference cell.

A read method of a PCRAM apparatus including at least one reference cell and a memory cell array according to an embodiment of the present invention includes: reading data of the reference cell in accordance with predetermined reference voltage; generating compensation reference voltage by controlling the reference voltage in accordance with the result of reading the data of the reference cell; and reading data stored in each memory cell of the memory cell array on the basis of the compensation reference voltage.

These and other features, aspects, and embodiments are described below in the section "Detailed Description".

BRIEF DESCRIPTION OF THE DRAWINGS

Features, aspects, and embodiments are described in conjunction with the attached drawings, in which.

DETAILED DESCRIPTION

Preferred embodiments are described hereafter in detail with reference to the accompanying drawings.

Generally, in a nonvolatile memory apparatus, such as a PCRAM, a specific word line is enabled and write/read operations are performed at the same time for all memory cells coupled to the enabled word line. Accordingly, data is written and read at the same time in a plurality of memory cells included in a specific memory cell array. Therefore, as time passes after data has been written at the same time in memory cells, substantially the same amount of resistance shift occurs for the memory cells of the specific word line.

In consideration of this feature, in an embodiment of the present invention, the same type of data (e.g., multi-level data such as 2 bit data) is written in a reference cell (array) as that which is normally written in a memory cell. For example, when a predetermined word line is activated, data is written to the reference cell connected to the word line as well as the memory cells connected to the word line. The data written to the reference cell is written before data is written in a corresponding memory cell array. Further, a change in the resistance value of the reference cell is checked by first reading the data written in the reference cell (array), before the data is read from the predetermined memory cell array. The amount of electric current flowing in the reference cell changes in proportion to the change in the resistance value of the reference cell, and the level of reference voltage that is used to read the memory cell array is adjusted in order to compensate for the change.

In this regard, the reference cell referred to in the present invention can also be referred to as a time recording cell (TRC).

Figure 1:
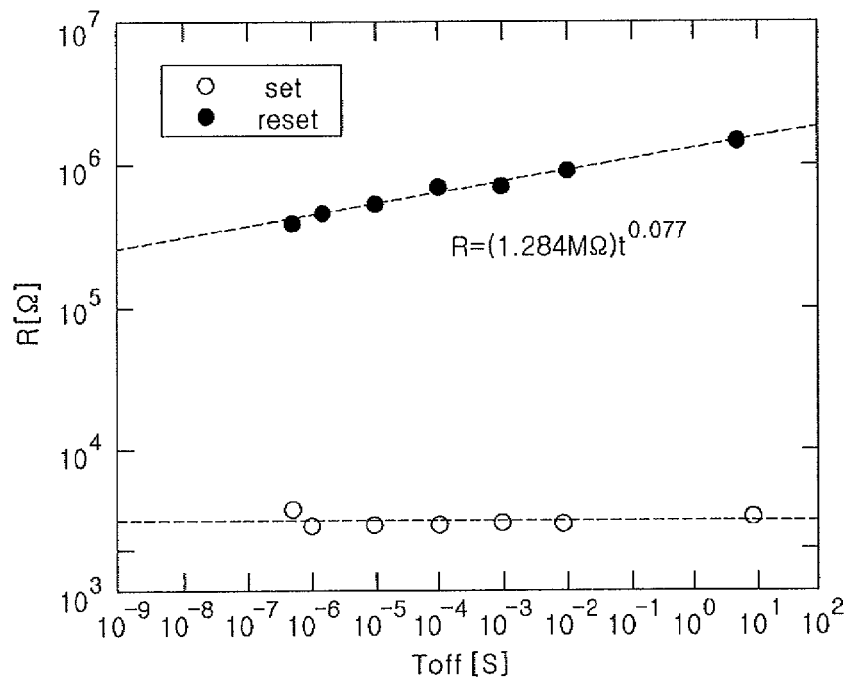
FIG. 1 is a graph illustrating resistance characteristics of a phase change material with respect to time.
Figure 2:
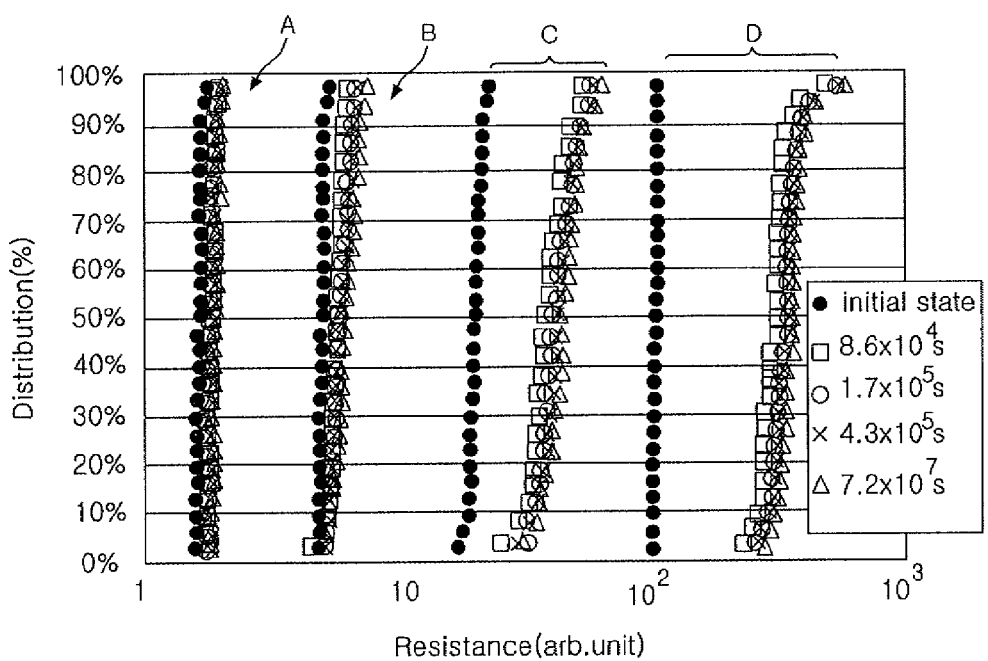
FIG. 2 is a graph illustrating resistance distribution with respect to time in a multi-level PCRAM apparatus
Figure 3:
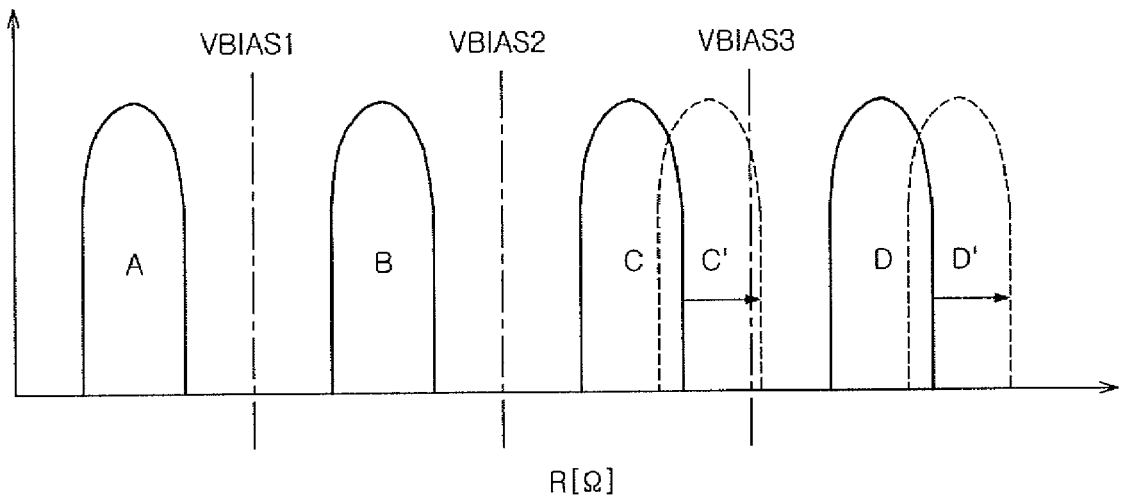
FIG. 3 is a diagram illustrating the resistance shift in a PCRAM apparatus.
Figure 4:
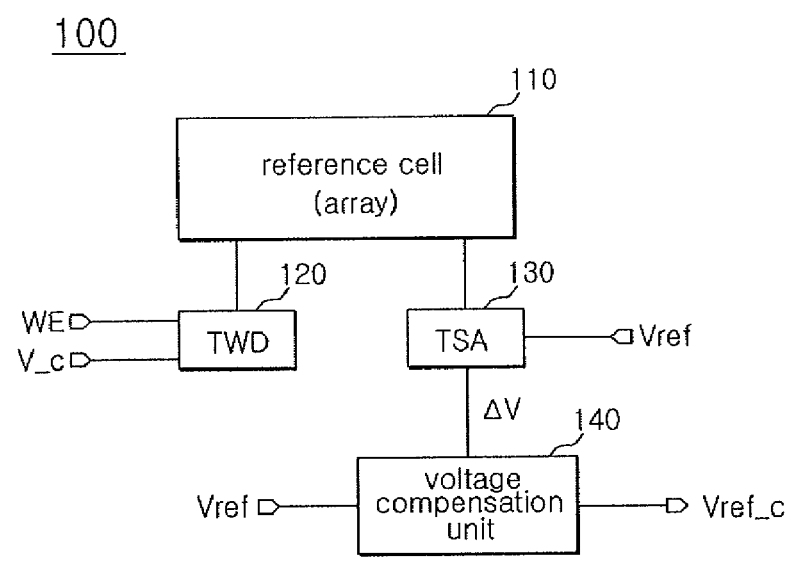
FIG. 4 is a diagram showing the configuration of a circuit for generating a reference voltage according to an embodiment of the present invention.

FIG. 4 is a diagram showing the configuration of a circuit for generating reference voltage according to an embodiment of the present invention.

As shown in FIG. 4, a circuit for generating reference voltage 100 according to an embodiment includes a reference cell (array) 110, a write driver for reference cell (TWD) 120 for writing data to the reference cell (array) 110, a sense amplifier for reference cell (TSA) 130 which reads and amplifies data written in the reference cell (array) 110, and a voltage compensating unit 140 that controls/adjusts the level of a reference voltage 'Vref' and supplies it as a compensation reference voltage to the sense amplifier connected to a memory cell array in accordance with the result of sensing data by the sense amplifier for reference cell 130.

The reference cell (array) 110 may be at least one PCRAM cell and it should be manufactured under the same conditions as the PCRAM cell used for storing actual data.

The write driver for reference cell (TWD) 120 changes the resistance state of a phase change material included in the reference cell (array) 110 by applying an electric current based on a bias voltage 'V_c' to the reference cell (array) 110 in response to a write enable signal 'WE'. That is, the write driver (TWD) 120 writes data corresponding to the bias voltage 'V_c'.

In response to a read command, the sense amplifier for reference cell (TSA) 130 compares the data stored in the reference cell (array) 110 to the reference voltage 'Vref'. The data written in the reference cell array is read out before reading the data stored in the corresponding memory cell. In an embodiment, the reference voltage 'Vref' is a predetermined voltage for discriminating the state of the most significant bit (MSB) of the multi-level data. Therefore, the sense amplifier for reference cell (TSA) 130 outputs a voltage corresponding to the difference ΔV between the voltage read out from the reference cell (array) 110 and the reference voltage 'Vref'.

Meanwhile, the voltage compensating unit 140 outputs a compensation reference voltage 'Vref_c' by controlling the reference voltage 'Vref' according to the read result of the sense amplifier for reference cell (TSA) 130 so as to output an adjusted compensation reference voltage 'Vref_c'. The compensation reference voltage 'Vref_c' may then be provided to the sense amplifier of the actual memory cell array and is used in the operation of reading a memory cell. Accordingly, in an embodiment, the voltage compensating unit 140 may be a common reference voltage generator that generates a compensation reference voltage 'Vref_c' by increasing (or decreasing) the reference voltage as much as the level of the output voltage of the sense amplifier for reference cell (TSA) 130, in response to the output data and the reference voltage 'Vref' of the sense amplifier for reference cell (TSA) 130.

In detail, when the voltage level of the data read out from the reference cell is larger than the reference voltage 'Vref', the voltage compensating unit 140 increases the reference voltage as much as the difference to output the compensation reference voltage 'Vref_c'. On the other hand, when the voltage level the data read out from the reference cell is smaller than the reference voltage 'Vref', the voltage compensation unit 140 decreases the reference voltage as much as the difference to output the compensation reference voltage 'Vref_c'.

Accordingly, as described above, in an embodiment of the present invention predetermined data is written in the reference memory cell (array) 110 and then the reference voltage is compared to the voltage level of the data stored in the reference cell (array) in a read operation. Accordingly, it is possible to determine the variation of the resistance of the reference cell and, on the basis of this determination, reference voltage applied to the sense amplifier for memory cell array is controlled.

Further, the larger the number of reference cells 110, the more accurately the reference voltage can compensated.

Figure 5:
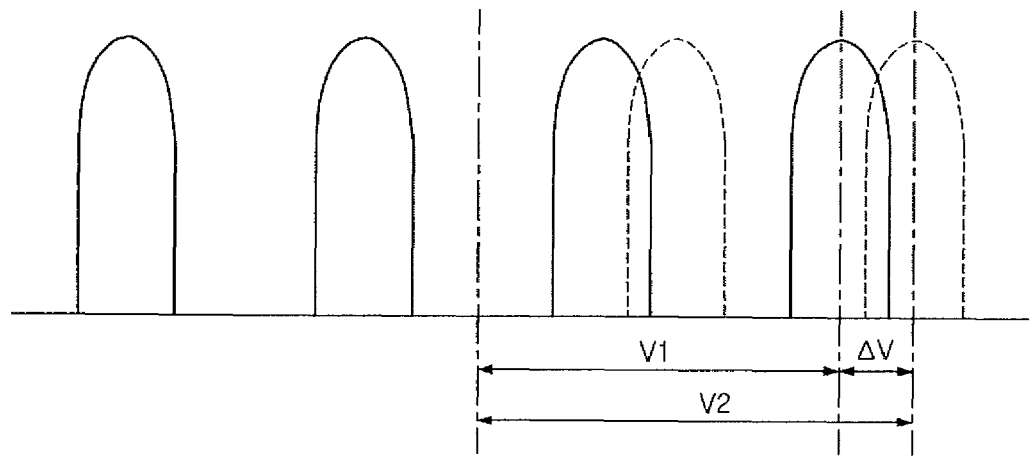
FIG. 5 is a diagram illustrating the compensation principle of reference voltage in a circuit for generating reference voltage according to an embodiment of the present invention.

FIG. 5 is a diagram illustrating the compensation principle of reference voltage in a circuit for generating reference voltage of the present invention.

For example, 11 data is written in the reference cell (array) 110. In the illustration shown in FIG. 5, the voltage difference between the reference voltage 'Vref' and the reference cell (array) 110 is V1. After a predetermined time passes, the resistance value of the reference cell (array) 110 can change, and accordingly, the voltage difference between the reference voltage 'Vref' and the reference cell (array) 110 becomes V2. Accordingly, since the voltage changes as much as ΔV(=V2−V1), a compensation reference voltage (Vref_c=Vref+ΔV) is generated by compensating ΔV for the reference voltage 'Vref'.

As described above, it is possible to more accurately read data using the compensation reference voltage 'Vref_c' when reading the actual data of a memory cell array, by checking in advance the variation of the resistance of a cell and controlling the reference voltage.

Figure 6:
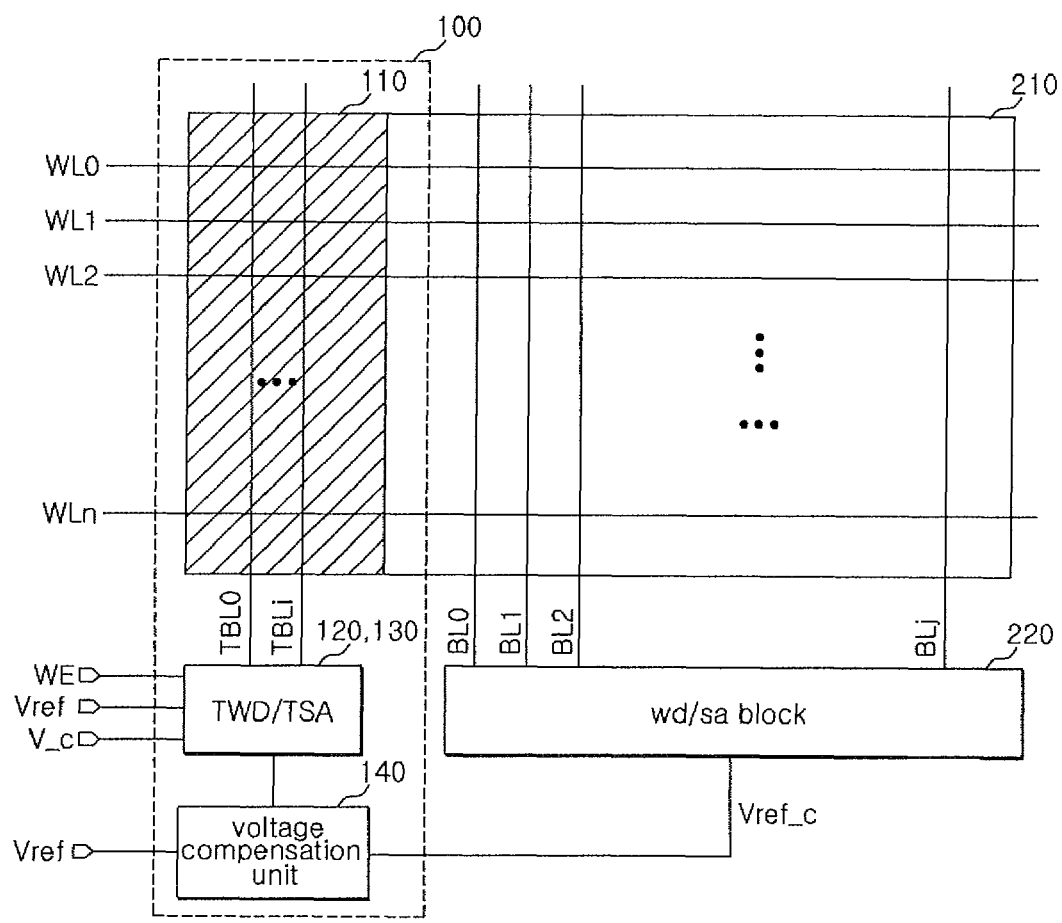
FIG. 6 is a diagram showing the configuration of a PCRAM apparatus according to an embodiment of the present invention.

FIG. 6 is a diagram showing the configuration of a PCRAM apparatus according to an embodiment of the present invention.

A PCRAM apparatus according to an embodiment of the present invention includes a circuit for generating reference voltage 100 configured to generate a compensation reference voltage 'Vref_c' by writing/reading data to/from a reference cell and controlling a reference voltage to output a compensated reference voltage Vref_c; a memory cell array 210 having memory cells where word lines 'WL0' to 'WLn' and bit lines 'BL0' to 'BLj' intersect, and a write driver/sense amplifier block 220 that writes data to the memory cell array 210 and reads the data stored in the memory cell array 210 using the compensation reference voltage 'Vref_c' generated by the circuit for generating reference voltage 100.

Further, the circuit for generating reference voltage 100 includes a reference cell (array) 110 having memory cells where word lines 'WL0' to and bit lines for reference cells 'TBL0' to 'TBLi' intersect; a write driver for reference cell 120 and sense amplifiers for reference cell 130 which write/reads out to/from the reference cell (array) 110, and a voltage compensation unit 140 configured to generate a compensation reference voltage 'Vref_c' by controlling/adjusting the reference voltage 'Vref' in accordance with the output value of the sense amplifier for reference cell 130.

When a write enable signal 'WE' is enabled and a predetermined word line is selected, the bit line for reference cell 'TBL' is selected and the same type of data is written to the reference cell as that which is normally written to the memory cell array by the write driver for reference cell 120. Further, as the bit lines 'BL' are sequentially enabled, data is written to the memory cell array 210 by the write driver 'WD' 220.

On the other hand, when a read enable signal is inputted, the difference between the voltage of the data stored in the reference cell (array) 110 and the reference voltage 'Vref' is sensed by the sense amplifier for reference cell 'TSA' 130 and the voltage compensation unit 140 generates compensation reference voltage 'Vref_c' by controlling the reference voltage 'Vref' to output an adjusted compensation voltage Vref_c.

Accordingly, the sense amplifier 'SA' 220 reads the data stored in the memory cell array 210 using the compensation reference voltage 'Vref_c'.

Figure 7:
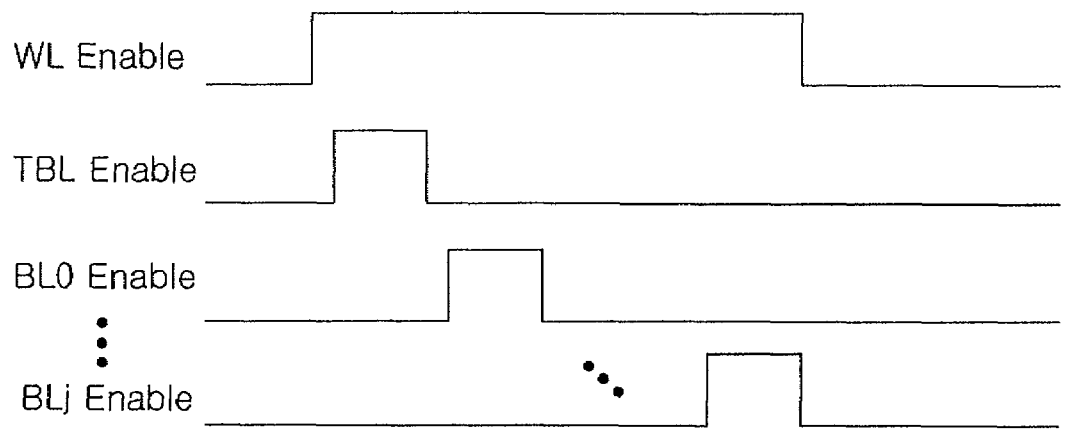
FIG. 7 is a timing diagram illustrating a method of writing data in a PCRAM apparatus according to an embodiment of the present invention.

FIG. 7 is a timing diagram illustrating a method of writing data in a PCRAM apparatus of the present invention.

When a predetermined word line is enabled in accordance with a write enable command for writing data, the bit line for reference cell 'TBL' is enabled, and accordingly, data is written in the reference cell.

Thereafter, the bit lines 'BL0' to 'BLj' connected to the memory cell array are sequentially enabled and data is written in the memory cell array.

Figure 8:
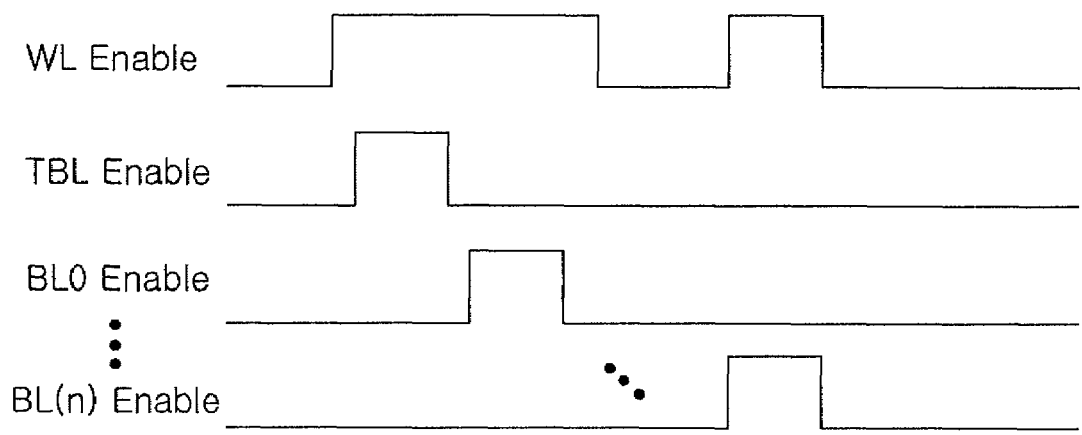
FIG. 8 is a timing diagram illustrating a method of reading data in a PCRAM apparatus according to an embodiment of the present invention.

FIG. 8 is a timing diagram illustrating a method of reading data in a PCRAM apparatus of the present invention.

In order to read the data stored in the memory cell array after writing the data as described with reference to FIG. 7, when a predetermined word line is enabled in accordance with a read command, first, the bit line for reference cell 'TBL' is enabled and the data is read from the reference cell, and then a compensation reference voltage is generated on the basis of the data.

Further, as the bit lines 'BL0' to 'BLj' connected to the memory cell array are sequentially enabled, data is read out by comparing the amount of electric current flowing in each memory cell with the amount of electric current by the compensation reference voltage.

Since the reference voltage compensated in accordance with a shifted resistance value is used when the data stored in each memory cell of the memory cell array is read, it is possible to reliably read data even with the resistance change of the phase change material.

To sum up, reference voltage for a read operation is generated on the basis of the change of a resistance value of a phase change material. Accordingly, even if the resistance value of the phase change material increases as time passes, the reference voltage is set on the basis of the changed resistance value, such that the data stored in a cell can be read out with increased accuracy.

Therefore, it is possible to ensure a sufficient sensing margin even when storing multi-level data over 2 bits, such that it is possible to ensure reliability in the operation of the PCRAM apparatus and increase integration per unit area.

Meanwhile, although the conception of the circuit for generating reference voltage and compensation of the reference voltage of a PCRAM apparatus were described above, the present invention is not limited thereto and can be applied to any types of memory apparatuses as long as the memory apparatuses use a variable resistance.

While certain embodiments have been described above, it will be understood that the embodiments described are by way of example only. Accordingly, the apparatus and method described herein should not be limited based on the described embodiments. Rather, the apparatuses and methods described herein should only be limited in light of the claims that follow when taken in conjunction with the above description and accompanying drawings.

What is claimed is:

1. A circuit for generating reference voltage, comprising:
   at least one reference cell, the reference cell being a variable resistance memory cell;
   a reference cell write driver configured to write data to the reference cell;
   a reference cell sense amplifier configured to output an output value by reading out the data stored in the reference cell on the basis of a predetermined reference voltage; and
   a voltage compensation unit configured to output a compensation reference voltage having a value adjusted according to the output value of the reference cell sense amplifier.

2. The circuit for generating reference voltage according to claim 1, wherein the voltage compensation unit is configured to increase or decrease the reference voltage according to the difference between the voltage level of the data stored in the reference cell and the voltage level of the reference voltage in order to output the increased or decreased reference voltage as the compensation reference voltage.

3. The circuit for generating reference voltage according to claim 2, wherein the reference cell is a multi-level memory cell and the reference voltage is a reference voltage for discriminating the most significant bit.

4. The circuit for generating reference voltage according to claim 1, further comprising at least one memory cell corresponding to the at least one reference cell, and a memory cell sense amplifier,
wherein the reference cell write driver is configured to write data to the reference cell in response to a write enable signal indicating a write is to be performed in the corresponding memory cell,
wherein the memory cell sense amplifier is configured to read data stored in the memory cell using the compensation reference voltage.

5. A method of generating reference voltage, comprising:
writing data to a reference cell, the reference cell being a variable resistance memory cell;
reading the data of the reference cell in accordance with a predetermined reference voltage; and
generating a compensation reference voltage by adjusting the reference voltage in accordance with the result of reading the data of the reference cell.

6. The method of generating reference voltage according to claim 5, wherein the step of reading the data of the reference cell includes detecting the difference of voltage level between the voltage level of the reference voltage and the voltage level of the data stored in the reference cell.

7. The method of generating reference voltage according to claim 6, wherein the step of generating the compensation reference voltage includes increasing or decreasing the reference voltage according to the difference of voltage level.

8. A phase change random access memory (PCRAM) apparatus, comprising:
a memory cell array including at least one memory cell coupled between a word line and a bit line;
a reference voltage generating circuit comprising at least one reference cell and configured to generate a compensation reference voltage by writing data to a reference cell, reading the data from the reference cell, and adjusting a predetermined reference voltage; and
a sense amplifier configured to read data of the memory cell in accordance with the compensation reference voltage.

9. The phase change random access memory apparatus according to claim 8, wherein the reference voltage generating circuit comprises:
the at least one reference cell coupled between the word line and a reference cell bit line;
a reference cell write driver configured to write data to the reference cell;
a reference cell sense amplifier configured to output an output value by reading out the data stored in the reference cell on the basis of the reference voltage; and
a voltage compensation unit configured to output the compensation reference voltage by adjusting the reference voltage in accordance with the output value of the sense amplifier.

10. The phase change random access memory apparatus according to claim 9, wherein the bit line connected to the memory cell array is enabled after the reference cell bit line is enabled and data is written, in a write operation of the phase change random access memory apparatus.

11. The phase change random access memory apparatus according to claim 10, wherein the bit line connected to the memory cell array is enabled after the reference cell bit line is enabled and data is read, in a read operation of the phase change random access memory apparatus.

12. The phase change random access memory apparatus according to claim 8, wherein the reference voltage generating circuit is further configured to increase or decrease the reference voltage in accordance with the difference between the voltage level of the data stored in the reference cell and the voltage level of the reference voltage.

13. The phase change random access memory apparatus according to claim 12, wherein each of the at least one memory cell of the memory cell array and the reference cell are multi-level memory cells and the reference voltage is reference voltage for discriminating the most significant bit.

14. A read method of a phase change random access memory apparatus including at least one reference cell and a memory cell array, the read method comprising:
reading data of the reference cell in accordance with predetermined reference voltage;
generating a compensation reference voltage by controlling the reference voltage in accordance with the result of reading the data of the reference cell; and
reading data stored in at least one memory cell of the memory cell array on the basis of the compensation reference voltage.

15. The read method of a phase change random access memory apparatus according to claim 14, wherein the step of reading the data of the reference cell includes detecting the difference of voltage level between the voltage level of the reference voltage and the voltage level of the data stored in the reference cell.

16. The read method of a phase change random access memory apparatus according to claim 14, wherein the step of generating the compensation reference voltage includes increasing or decreasing the reference voltage in accordance with the difference of voltage level.

17. The read method of a phase change random access memory apparatus according to claim 14, wherein the data stored in the reference cell corresponds to data stored in the memory cell array.

* * * * *